United States Patent
Dixit et al.

(10) Patent No.: US 10,676,048 B2
(45) Date of Patent: Jun. 9, 2020

(54) PARAMETRIC DATA MODELING FOR MODEL BASED REASONERS

(71) Applicant: Northrop Grumman Systems Corporation, Falls Church, VA (US)

(72) Inventors: Sunil Dixit, Torrance, CA (US); Richard R Ramroth, Long Beach, CA (US); Nathan R Good, Torrance, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 44 days.

(21) Appl. No.: 16/163,726

(22) Filed: Oct. 18, 2018

(65) Prior Publication Data

US 2020/0122656 A1    Apr. 23, 2020

(51) Int. Cl.
| | |
|---|---|
| *B60R 16/023* | (2006.01) |
| *B64D 45/00* | (2006.01) |
| *G06N 5/04* | (2006.01) |
| *G06F 30/20* | (2020.01) |

(52) U.S. Cl.
CPC ......... *B60R 16/0234* (2013.01); *B64D 45/00* (2013.01); *G06F 30/20* (2020.01); *G06N 5/04* (2013.01); *B64D 2045/0085* (2013.01)

(58) Field of Classification Search
CPC ..... B60R 16/0234; G06F 30/20; B64D 45/00; B64D 2045/0085; G06N 5/04; G07C 3/00; G01D 1/18; G05B 23/0283; G05B 2219/37252; G05B 23/0243; G05B 23/0251
See application file for complete search history.

(56) References Cited

U.S. PATENT DOCUMENTS

| | | | |
|---|---|---|---|
| 6,208,955 B1 | 3/2001 | Provan et al. | |
| 7,457,785 B1* | 11/2008 | Greitzer | .................. G01D 1/18 706/12 |
| 8,838,324 B2 | 9/2014 | Suzuki | |
| 8,855,943 B1 | 10/2014 | Matsui | |
| 2005/0212523 A1 | 9/2005 | Chang | |
| 2006/0064291 A1* | 3/2006 | Pattipatti | ............ G05B 23/0251 703/14 |
| 2008/0312783 A1 | 12/2008 | Mansouri et al. | |
| 2015/0149119 A1 | 5/2015 | Fansler | |
| 2019/0147670 A1 | 5/2019 | Chopra | |

OTHER PUBLICATIONS

International Search Report in related Application Serial No. PCT/US19/043362, dated Nov. 8, 2019, 11 pages.

* cited by examiner

*Primary Examiner* — Anne Marie Antonucci
*Assistant Examiner* — Andrew J Cromer
(74) *Attorney, Agent, or Firm* — McCracken & Gillen LLC

(57) ABSTRACT

Methods and apparatus are provided for an integrated vehicle health management system that uses a model based reasoner to develop real-time diagnostic and maintenance information about a vehicle. A model having nodes is used to represent sensors, components, functions and other elements of the system. Parameterized input sensors provide flexible definitions of each node. Once developed, the model is loaded into an operational flight program to provide real-time failure analysis of the vehicle.

20 Claims, 7 Drawing Sheets

PARAMETRIC DATA MODELING FOR MODEL BASED REASONERS

TECHNICAL FIELD

Various example embodiments relate generally to model-based diagnosis systems and more particularly to parameterized input to a Model Based Reasoner (MBR) engine and diagnosis of equipment failures in an Integrated Vehicle Health Management (IVHM) system.

BACKGROUND

Complex systems, such as vehicles, aircraft, spacecraft and other systems, typically include many subsystems for controlling and managing the vehicle. Throughout the specification, it should be understood that a reference to a vehicle encompasses a variety of complex systems. It is desirable to identify adverse events or failures that may be occurring in one or more of these subsystems, particularly during real-time operation of the vehicle. Integrated Vehicle Health Management systems may be used to monitor and diagnose various characteristics (failure modes) of the vehicle. Model-based systems using models, rules, decisions, and cases (i.e., expert systems) about system behavior have been developed to create a functional model of a system that receives and evaluates inputs from sensors and other data sources within the vehicle. However, prior art models are integrated only at a subsystem level instead of encompassing an entire vehicle. In addition, a large amount of time and resources are required to develop and update the model in response to hardware and software upgrades over the life-cycle of the vehicle.

A rules based approach to engineering diagnostics solutions may use built-in test (BIT) data. BIT Engineering (considered to be a rules based approach) is not very effective for complex systems and is a main reason for high false alarm (FA) rates. The engineering effort involved in producing good rules is very costly and unaffordable in software and hardware upgrades over decades; therefore, the costs of maintaining these systems is immense—nearly 72% of the life-cycle cost goes in operations and support. In addition, equipment BIT information may be supplied by different vendors and generally does not follow a consistent standard.

SUMMARY

Example embodiments encompass an integrated vehicle health management system that uses a model based reasoner to develop real-time diagnostic and maintenance information about a vehicle. In an embodiment, an on-board diagnostic system for a complex system having a computer processor and a non-volatile storage includes an interface for receiving data including sensor data from a plurality of sources in the complex system; a model representing the complex system, said model further comprising a plurality of nodes in a graph, said nodes representing functions, components, and sensors of the complex system, at least some of said nodes representing parameterized data, direct analog sensor data and built-in-test (BIT) data, said model further comprising an XML model configuration file stored in the non-volatile storage; a model development and verification interface for creating and verifying the model; a model testing manager for evaluating the model; a model based reasoner (MBR) engine executed by the computer processor, said MBR engine receiving data from the input interface, implementing the model from its corresponding XML model configuration file, and producing diagnostic analysis and data for the complex system; and a maintenance viewer for receiving the diagnostic analysis and data and providing actionable maintenance tasks and reports.

In a further embodiment, the model testing manager evaluates the model using simulated data or captured operational data from the complex system.

In an embodiment, a method of integrated vehicle health management (IVHM) for a complex system includes the steps of generating a model representing the complex system, said model further comprising a plurality of nodes in a graph, said nodes representing functions, components, and sensors of the complex system, at least some of said nodes representing parameterized data, direct analog sensor data and built-in-test (BIT) data; verifying the model; testing the model; exporting the model to an XML model configuration file; executing a model based reasoner (MBR) engine using the model and sensor data from a plurality of sources in the complex system and producing diagnostic analysis and data for the complex system; and performing maintenance of the complex system based on the diagnostic analysis and data.

In a further embodiment, the testing step further includes evaluating the model using simulated data or captured operational data from the complex system.

In any of the above embodiments, at least one node further includes a component node for representing a system element having a state and a status, a function node for logically combining outputs from other nodes or a physical sensor node for providing parameterized data to the model.

In any of the above embodiments, the parameterized data further includes upper and lower bounds on the sensor data.

In any of the above embodiments, the parameterized data further comprises a calibration value.

In any of the above embodiments, at least one node further comprises a physical sensor node for providing BIT data to the model or a physical sensor node for providing direct physical sensor quantitative data to the model.

In any of the above embodiments, a graphical user interface may be provided for creating and testing the model representing the complex system.

DESCRIPTION OF THE DRAWINGS

Some example embodiments will now be described with reference to the accompanying drawings in which.

DETAILED DESCRIPTION

Integrated Vehicle Health Management (IVHM) using Model Driven Architectures (MDA) and Model Based Engineering (MBE) is a solution where software and hardware elements are flight qualified once instead of every time the system is changed or upgraded. This results in significant cost savings by using an XML format configuration file containing a model with the diagnostics domain knowledge of the system. The model needs to be verified for accuracy but does not require expensive and time-consuming software flight qualification. This saves between 25%-35% in military operations and support costs.

Figure 1:
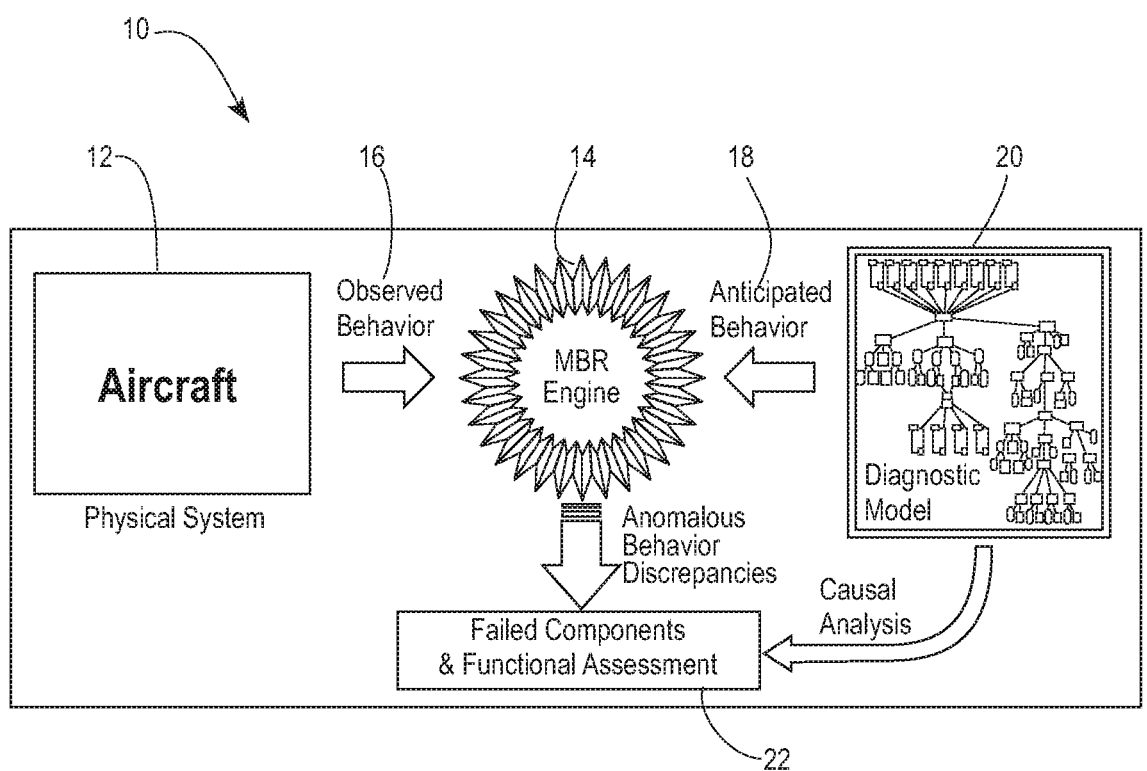
FIG. 1 shows a block diagram of an on-board operational IVHM system and its interfaces for diagnostic analysis of equipment failures in an aircraft.

FIG. 1 shows the functional behavior and interfaces of an IVHM system 10 on aircraft 12 where MBR Engine 14 runs on a computation device (not shown) in an avionics bay of aircraft 12. Although an aircraft is shown and discussed with reference to FIG. 1, embodiments are not limited to this type of vehicle. Observed behavior 16 refers to the BIT, parametric, and sensor data obtained from various aircraft avionics data buses. Anticipated behavior 18 refers to what is expected from the modeled domain knowledge 20 of the various subsystems, line replaceable units (LRUs), and components of entire system (this model is represented in XML format). Component refers to subsystems, LRUs, and components. When observed behavior 16 is different from the anticipated behavior 18 anomalous behavior (discrepancies/residues) is registered and MBR Engine 14 goes into a diagnostics mode (causal analysis). With various reasoning algorithms and analysis of the BIT, parametric, and sensor data MBR Engine 14 produces results 22 that include detection of failed components; isolation to a single failed component or an ambiguity group of similar components; false alarm identification; functional assessment of the failed component (i.e., leakage in a pump, leakage in a pipe, blockage of air flow, bearing damage, and other assessments dependent on the physics of the component); and unknown anomalies. In case of an unknown anomaly, model 20 is refined with additional information on the component and its interactions with other components related to its failure modes. This information is obtained from the manufacturers of these components and additional failure modes are added to the existing model. To reduce the ambiguity group of similar elements in a chain (series or parallel), typically additional sensors are required to isolate to a specific component within the ambiguity group. If additional sensors cannot be applied due to size, weight, and power limitations the maintainer must perform off-board diagnostics analysis within the localized ambiguity group.

Figure 2:
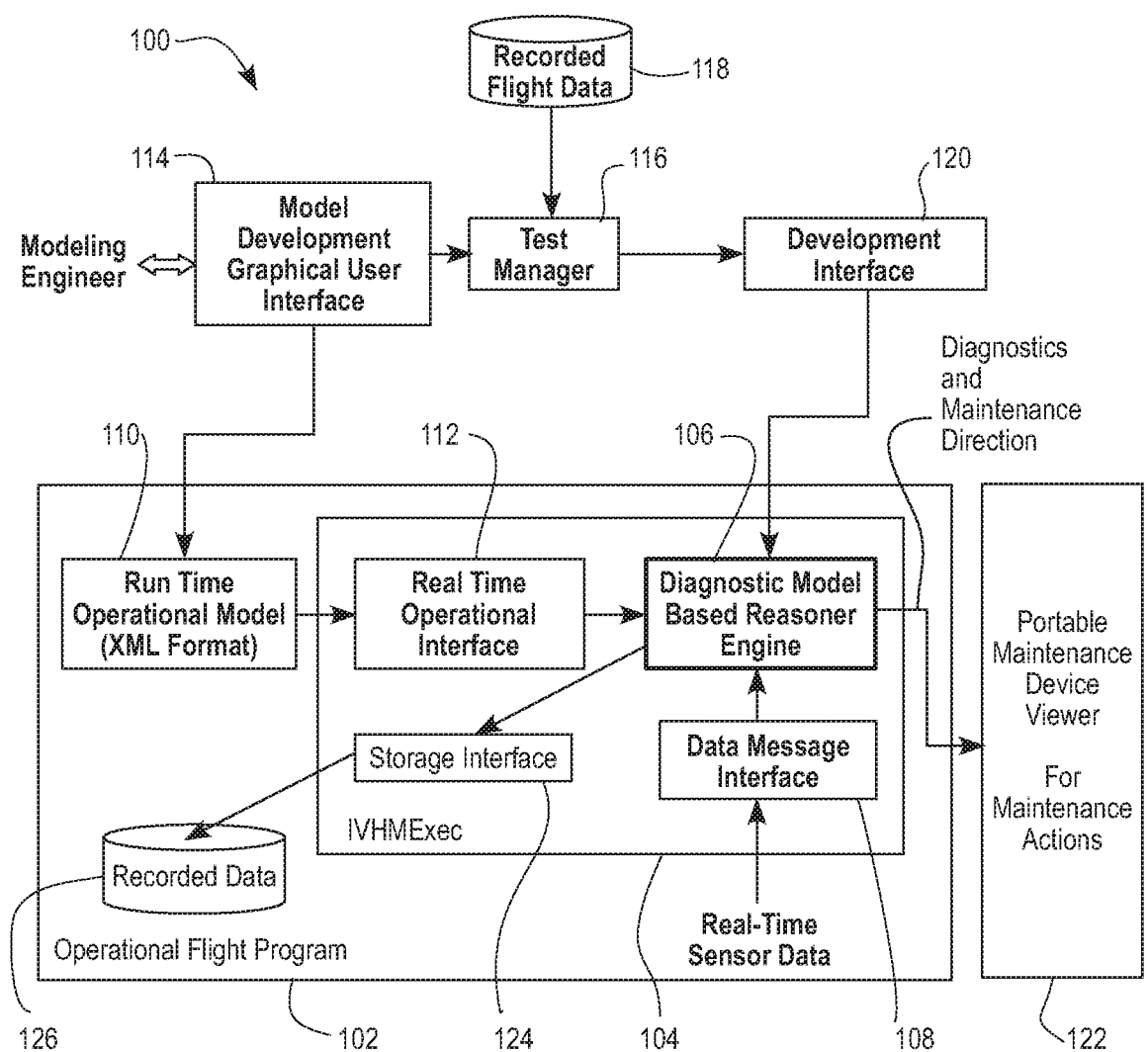
FIG. 2 shows a block diagram of design, operations, and maintenance processes & interfaces of the IVHM system.

FIG. 2 shows a block diagram of an IVHM system 100. The various components of FIG. 2 are linked together to logically combine their interconnected functions, failure modes, failure probabilities, and functional assessments in the modeled system, and also linked to sources of design (114, 116, 118, 120), real-time or post-processed input data distributed to the pilot's display (obtained from Operational Flight Program 102), ground systems (obtained from OFP 102), and storage on disk (126) for maintainer's on-ground maintenance actions 122. For discussion purposes, IVHM system 100 is represented as a block diagram but the functions and methods described maybe logically combined in hardware components in a variety of ways.

Operational Flight Program (OFP) 102 encompasses hardware and software for managing the overall operation of the vehicle. OFP 102 includes a runtime diagnostics engine IVHMExec 104. OFP 102 may also be implemented as a standalone avionics IVHM computer attached passively to the avionics data buses, actively interfaced with mission planning systems, and actively interfaced with ground systems and maintenance systems 122. IVHMExec 104 includes a diagnostic Model Based Reasoner (MBR) Engine 106. MBR Engine 106 combines a physical model of a vehicle system or subsystem with input data describing the system state, then performs deterministic inference reasoning to determine whether the system is operating normally, if any system anomalies exist, and if so, to isolate and identify the locations and types of faults and false alarms that exist. IVHMExec 104 writes maintenance records to a disk 126 that may also be accessed by Portable Maintenance Device Viewer 122.

MBR Engine 106 receives real-time sensor data through Data Message Interface 108. It also receives a Run Time Operational Model 110 of the vehicle through Real-Time Operational Interface 112. Model 110 of the vehicle is created by a modeling engineer using a Model Development Graphical User Interface (GUI) 114. Model 110 is created and verified with the MBR Engine 106 offline (non-real time) and then exported to an XML file that is used by a real-time embedded build of IVHMExec 104. In addition to creation of model 110, GUI 114 is also used to verify the model. Verification and validation is a test of the model's internal logic and elements, without the use of any specific input data. This process is necessary to ensure that the model is logically consistent, without errors that would prevent it from operating properly or not at all.

As a further step in the model development process, Test Manager 116 evaluates a model by testing it against simulated or actual flight data 118. Development Interface 120 allows for modification and addition of MBR Engine 106 algorithms, which are separate classes statically or dynamically linked to the IVHMExec 104 runtime executable (statically for standalone IVHMExec and dynamically for integration with the Graphical User Interfaces (GUIs)). While verification tests a model logically, Test Manager 116 ensures that the model performance and output is as desired. Once a model is verified and tested, a n XML model configuration file 110 is generated.

IVHMExec 104 is the executive that loads the XML representation of the model and executes the MBR Engine 106 in real-time by applying the model to input sensor data messages as they are received from various buses in the vehicle and/or stored history data in various formats for replay on ground. IVHMExec 104 may also be used by Test Manager 116 through Development Interface 120. Storage interface 124 connects MBR Engine 106 to Recorded Data storage 126. Recorded Data 126 includes log files, complete time-stamped state of the equipment, for example, snapshots, time-stamped fault/failure anomalies, detections, isolations, and any functional assessments on the isolations. The log files may also include the MBR Engine software states (version number, failures & reboots) as well as identification of other aircraft software, their version number, if failed their state at failure, reboots of software, and functional assessments that lead to the failure. Collection of this data allows for the replay of diagnostics visualization of the actual events that occurred on the aircrafts, and allows the maintainer to better understand both hardware and software interactions leading to the failed component(s). Recorded Data storage 126 stores the raw data used by the MBR Engine 106 and the results of its processing.

In an embodiment, MBR Engine 106 includes dynamically calibrated data input capability, and a set of logic gates (intersection AND, union OR, exclusive-or XOR, and others), rules, cases (histories), and decision trees combined in sensor logic for IVHM data fusion of parameterized and direct analog sensor data with corresponding Built-In-Test (BIT) inputs. A comparison of parametric data, direct analog sensor data, and BIT results produces confidence measures in failure and false alarm predictions.

An example of the creation of a model for use by MBR Engine 106 will now be described. In an embodiment, the model provides for data fusion from many sources within a modeled vehicle. In particular, the model may include parameterized data input capabilities that allow MBR Engine 106 to include analog and quantified digital data input, with either fixed or dynamically calibrated bounds to the measured physical quantities to determine the existence of anomalies. The parameterized data anomaly decision can be based on simple fixed bounds, dynamically changing calibration values based on physical sensor operations, or more complex decision properties including signal noise reduction, windowing, latency times and similar parameterized data conditioning. These data calibration parameters and thresholds become sensor node properties for evaluation during real time operations of the system. Functions can be represented as logic sets and operands while rules may be represented as logic sets or natural language semantics, historic behaviors (case based), or decision trees (fault tree analysis). For example, in the case of pressure functions, the model would evaluate whether flow pressure is provided and combine other inputs according to the function logic desired. In an embodiment, each input must indicate a positive result for the function to be evaluated as true although other logic functions may also be used. Various user-defined parameters for this function can be represented as node properties of the function. The XML MBR Model(s) 110 of the vehicle and the binary IVHMExec 104 real time engine running on an avionics computational device providing IVHM capability/functionality for the entire vehicle.

Figure 3:
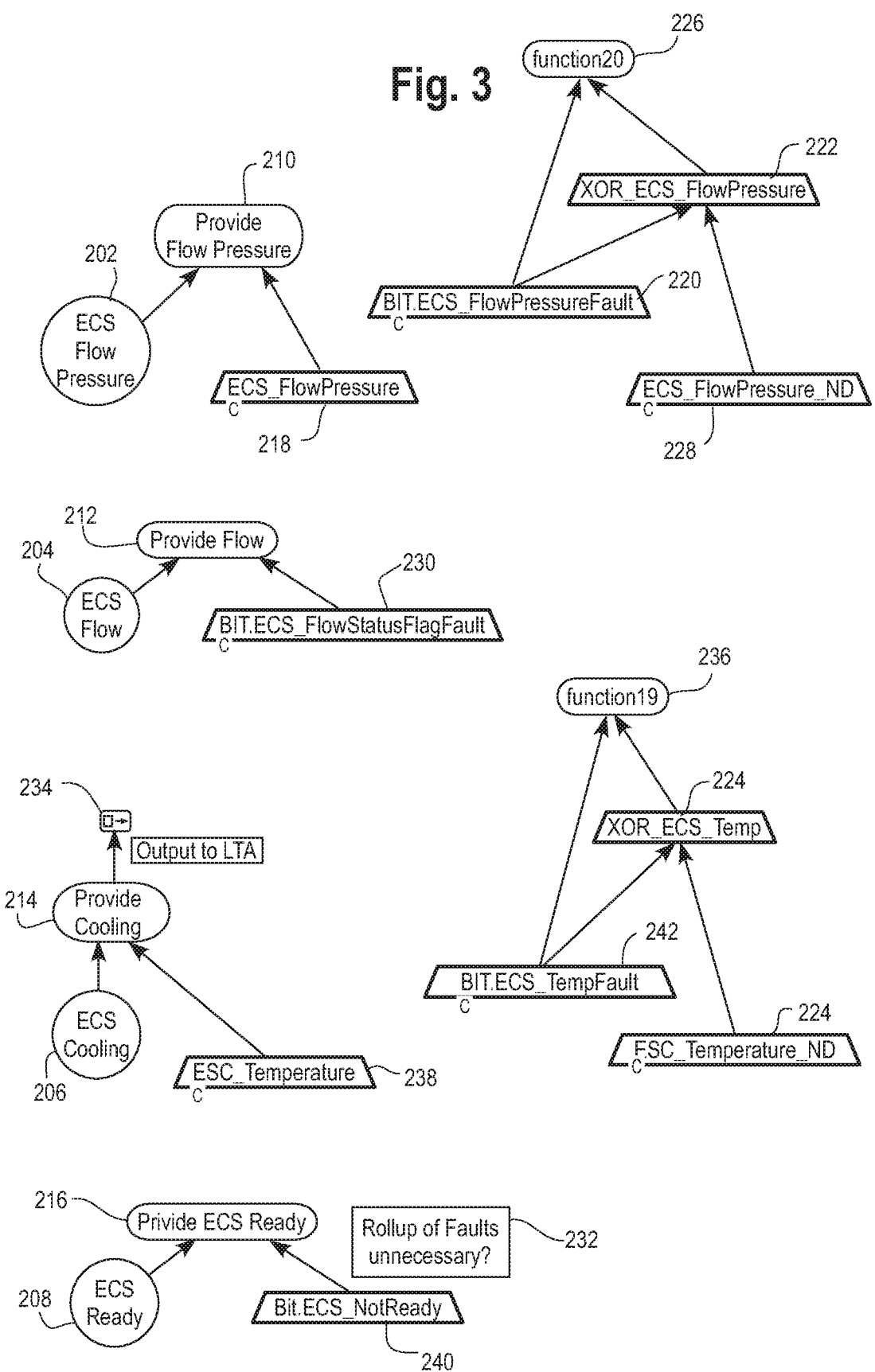
FIG. 3 shows a model of a subsystem for use with the IVHM system.

A parametric and BIT MBR model may include components and sensors that are related by their functions. In an embodiment, a model of a vehicle system or subsystem may be represented as nodes in a graph as shown in FIG. 3. In particular, FIG. 3 shows an example of an environment control subsystem (ECS) including both diagnostic or non-diagnostics nodes as it would be represented using the Model Development GUI 114 of FIG. 2. For the purposes of explanation, a specific example will be discussed, however, principles explained herein may be applied to any subsystem or system of a vehicle. A modeling engineer interacts with the model of FIG. 3 through the GUI 114 of FIG. 2.

Diagnostic nodes are used directly in the MBR model reasoning to determine the system components causing a fault or false alarm, while non-diagnostic nodes are used for tasks such as sensor output and BIT test comparison. The non-diagnostics nodes are used for real-time comparison of parametric sensor data with BIT data results. The parametric sensors represent the true system behavior (when the sensors have not failed), and if they are operating nominally when the BIT data show failure of corresponding components, this result is shown as a false alarm. Failed sensors are identified from false positive and false negative tests upon the sensors. Components, such as a Flow Pressure component, refer to a specific system element whose state (e.g. on, off, high or low pressure, etc.) and status (operational, failed, leaking, etc.) is indicated by MBR Engine 106, by connecting the component to other elements of the model. Sensor nodes are modeled with input data, which could take many forms, for example, direct sensor analog input, parametric data input and binary BIT data input. Referring to FIG. 3, a representative component node is shown as ECS Flow Pressure sensor node 202. Other component nodes include ECS Flow 204, ECS Cooling 206 and ECS Ready 208.

Figure 4:
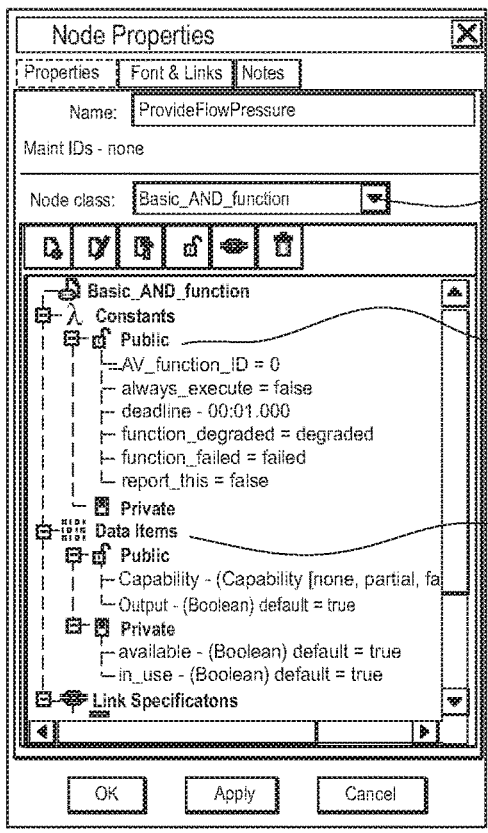
FIG. 4 shows a representation of a function node in the model of FIG. 3.

Another type of node in the model of FIG. 3 is a function node. A representative function node is shown as Provide Flow Pressure node 210. Other function nodes include Provide Flow 212, Provide Cooling 214 and Provide ECS Ready 216. Each of the function nodes in FIG. 3 represent a basic AND function. Provide Flow Pressure 210, for example, is used to determine if flow pressure is provided (logic sets and logic operands), combining other inputs according to the function logic desired. In this example, each input must indicate a positive result for the resulting state of the function to be true. Various user-defined parameters for function node 210 may be seen by a modeling engineer by double-clicking on the function node icon, which brings up the window shown in FIG. 4 for function node 210. The parameters defined in the Node Properties include the Node Class 302, default parameter values 304, and data items 306 defining the capabilities, output and status data types of node 210. Although specific labels and features are shown in FIG. 4, these may be varied depending on the function being modeled and the design of a modeled vehicle.

Figure 5:
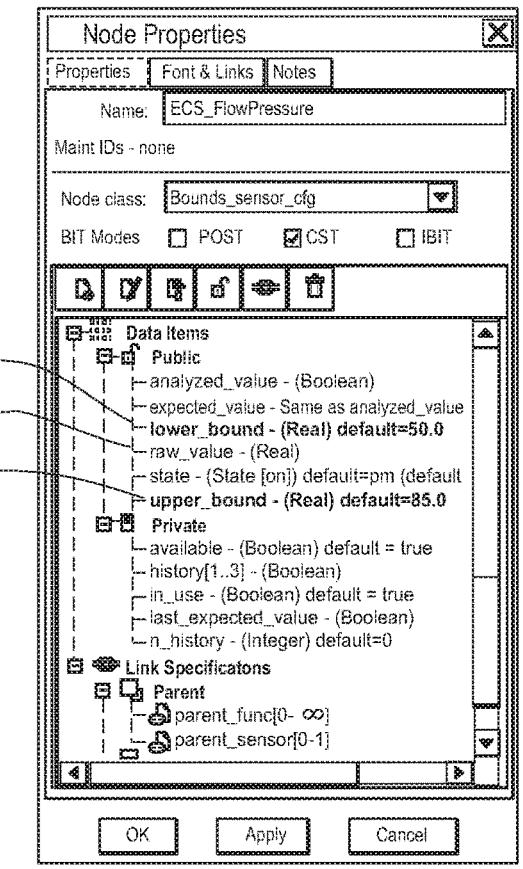
FIG. 5 shows a representation of a sensor node in the model of FIG. 3.

Another type of node in the model of FIG. 3 is a physical sensor node. A representative physical sensor node is shown as ECS_FlowPressure node 218 in FIG. 3. Another physical sensor node is shown as ECS_Temperature node 238. Physical and virtual nodes are used in the model to indicate input data, which could take many forms. As described above, a modeling engineer interacts with the model of FIG. 3 through GUI 114. Various user-defined parameters for physical sensor node 218 may be seen by a modeling engineer by double-clicking on the node icon, which brings up the window shown in FIG. 5 for physical sensor node 218. For sensor node 218, parameterized input data is used with fixed upper and lower bounds (allowable thresholds) defined as defaults in the Node Properties window shown in FIG. 5. The use of parameterized data allows for direct analysis of quantified sensor values, listed in the sensor Node Properties as raw_value 402 as seen in FIG. 5. In this case, the sensor raw_value 402 contains the measured flow pressure for the ECS subsystem. If raw_value 402 drops below the lower bound 404 or exceeds the upper bound 406, then the sensor indicates an anomaly, which is then used by MBR Engine 106 (FIG. 2) along with the rest of the model to determine the nature and cause of the anomaly.

Another example of a physical sensor node is BIT ECS_FlowPressureFault 220. This sensor uses Built-In-Test (BIT) data from the modeled system, which indicates either an anomaly or normal operation in the data output. This BIT test is designed to use the same upper and lower bounds as the corresponding parameterized sensor, but could produce a different result in the case of an anomalous operation. As such, we use the BIT test as an input along with a separate parameterized data input, into XOR_ECS_FlowPressure node 222 which is an exclusive logical or (XOR) sensor node. In some cases, only a BIT test sensor may be available to the maintainer; in this case, the BIT test will be used as a diagnostic sensor similar to the parametric sensor node used here for the ECS Flow Pressure 218. Other physical sensor nodes in the model of FIG. 3 include BIT_ECS_NotReady node 240 and BIT_ECS_TempFault node 242.

XOR_ECS_FlowPressure node 222 receives inputs from physical sensor node BIT_ECS_FlowPressureFault 220 and ECS_FlowPressure_ND 228, which is a parameterized input sensor node. The reason that a separate parameterized input sensor is used for the XOR input is because this input is non-diagnostic (no diagnostics cycle performed). Sensors can be either diagnostic, which means that they are used in the MBR engine to determine system faults and false alarms, or non-diagnostic to remove them from the MBR engine assessment. For XOR sensor input, a non-diagnostic parametric sensor input 228 is desirable to prevent interference with the MBR engine, as the XOR logic and output is complementary and separated from the MBR engine processing. In the example used here, the BIT test sensor 220 is also non-diagnostic, for the same reasons. In addition, for XOR sensors, a blank function 226 is used to fulfill a design requirement that each sensor has a downstream function attached to it. Another blank function is shown at 236. Similarly to node 222, XOR_ECS_Temp node 244 receives input from physical sensor node BIT_ECS_TempFault 242 and parameterized sensor node ECS_Temperature_ND 224.

XOR_ECS_FlowPressure node 222 produces a separate output stream, only indicating a positive Boolean result when the connected sensors (the parameterized sensor node 228 and the corresponding BIT test node 220) provide different assessments. Under normal operating conditions this should not happen, therefore the XOR sensor node is useful to determine when one of the system's BIT or parameterized inputs is providing an anomalous result. This provides the modeler with another tool to diagnose the system's health, which may otherwise be difficult to analyze.

An example of a case where only a BIT test data field is available is shown in FIG. 3 as BIT_ECS_FlowStatusFlag-Fault node 230 which provides sensor input to Provide Flow node 212. In this case, the BIT test node 230 is diagnostic, and used in the MBR Engine directly. Other model element types seen in FIG. 3 include comments shown, for example, as 232, describing model functionality, and output icon 234 which allows for model elements outside of those shown in the sub-model shown in FIG. 3 to communicate with the sub-model, specifically the Provide Cooling function node 214.

Figure 6:
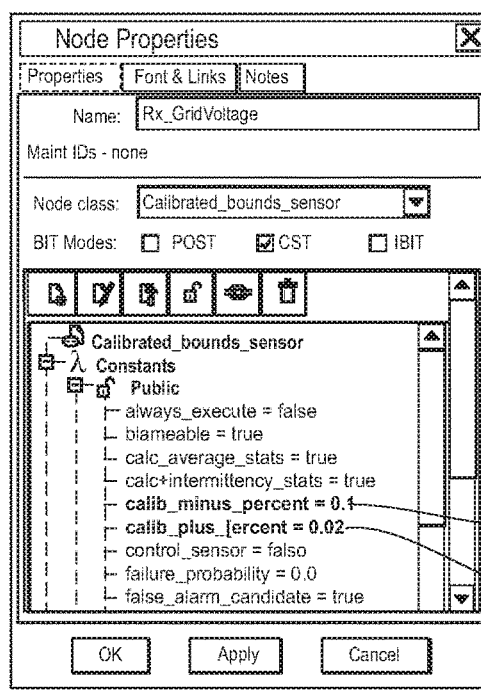
FIG. 6 shows a representation of a calculated bounds sensor node in the model of FIG. 3.

In some cases, parametric nodes will not have fixed upper and lower bounds. In this case, a separate node class can be used, as shown, for example, in FIG. 6. This node is not part of the subsystem model of FIG. 3. Here, a second input is used which provides a calibration value (for example, a calibration voltage) which may vary over time. The measured value must then fall in a percentage range defined by calib_minus_percent 502 and calib_plus_percent 504 (generally determined from subsystem supplier information) around the calibration value. This type of sensor node can be used in place of Bounds_sensor_cfg class nodes, such as ECS FlowPressure node 218 of FIGS. 3 and 5, when known calibration values for the limits of a parameterized sensor exist.

Figure 7:
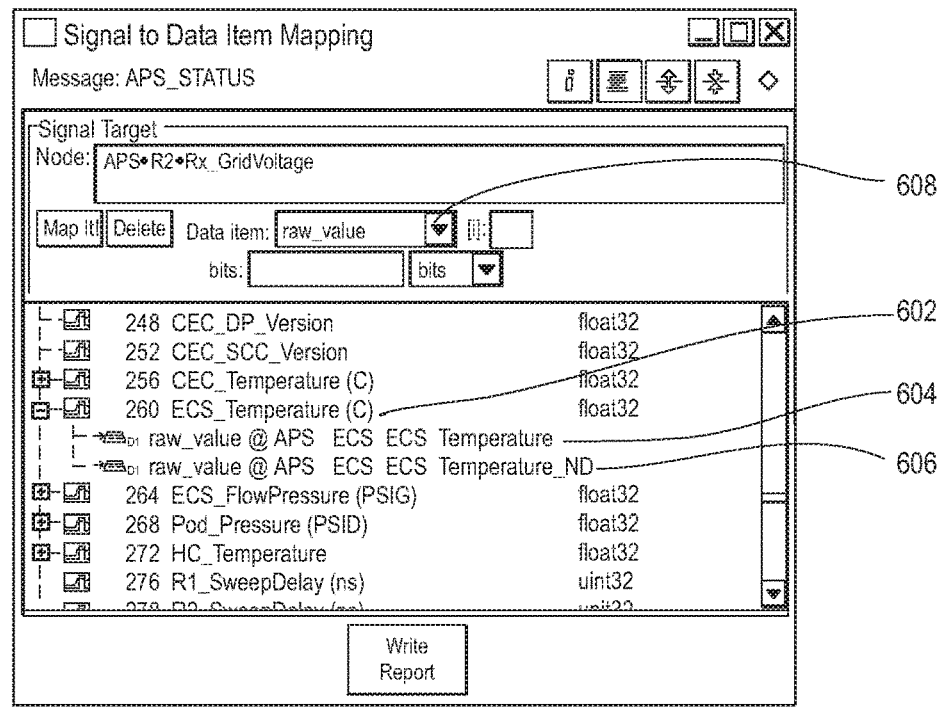
FIG. 7 shows a representation of a data mapping to sensor nodes.

In an embodiment, a model such as that shown in FIG. 3 includes a list of data fields corresponding to each element of the model. For example as shown in FIG. 7, the ECS_Temperature (C) 602 value is mapped to the diagnostic ECS_Temperature sensor node 604 and non-diagnostic ECS_Temperature sensor node 606 in the ECS submodule. These are the labels of data columns in a file format used as data input for this model, and allow for all data fields for various sensors in each subsystem to be defined systematically in one file. Separate data items are mapped for BIT test data nodes, and calibration data items for calibrated sensor nodes. The raw_value data item selection in the drop down menu 608 indicates that this example data item is a raw measurement value from the ECS temperature sensor. Each sensor in the model (parametric or BIT) is mapped to a data item, along with any calibration value data sets for calibrated parametric sensors.

Figure 8:
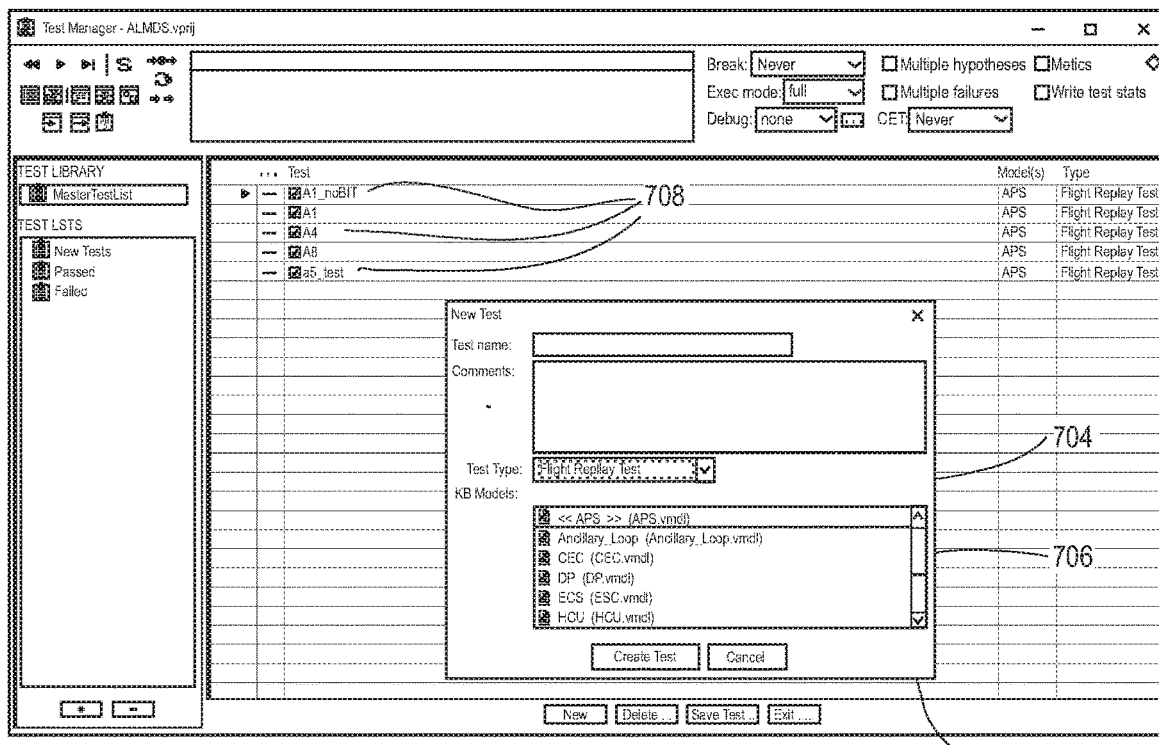
FIG. 8 shows a representation of a mechanism for testing a model for use with the IVHM system.

Referring back to FIG. 2, after an IVHM MBR model is built using Model Development GUI 114 (with all sensors, components and functions in place to emulate the operations of each subsystem), there are two methods to run the model using real or simulated system data. As explained above, GUI 114 contains a direct method to run the MBR model using recorded flight data 118 with Test Manager 116. FIG. 8 shows a representative Test Manager window with a New Test pop-up window 702. When Flight Replay Test 704 is selected, a suitable test simulated data or actual flight data file can be selected from options 706 and loaded into Test Manager 116. After a test of the model is run using a data file, an output file is generated and can be viewed with subsequently stored analyzed diagnostics results written as maintenance records. Other tests with flight data already may be selected from those shown at 708. The specific tests shown in FIG. 8 are representative examples only, and many other tests may also be used.

In an alternative embodiment, a modeling engineer using GUI 114 (FIG. 2) may test a model using a Command Line standalone version of IVHMExec 104 (FIG. 2). For this procedure, an XML (Extensible Markup Language) file containing information about the model and data mapping is generated. This file can be run with the Command Line standalone version of IVHMExec 104 to generate the output file at a predefined storage location, which can be loaded in PMD data viewer 122 (FIG. 2). This result should be the same as that generated in the Test Manager 116, but the Command Line procedure allows for batch file processing of large quantities of data sets and varying numbers of system MBR models.

Figure 9:
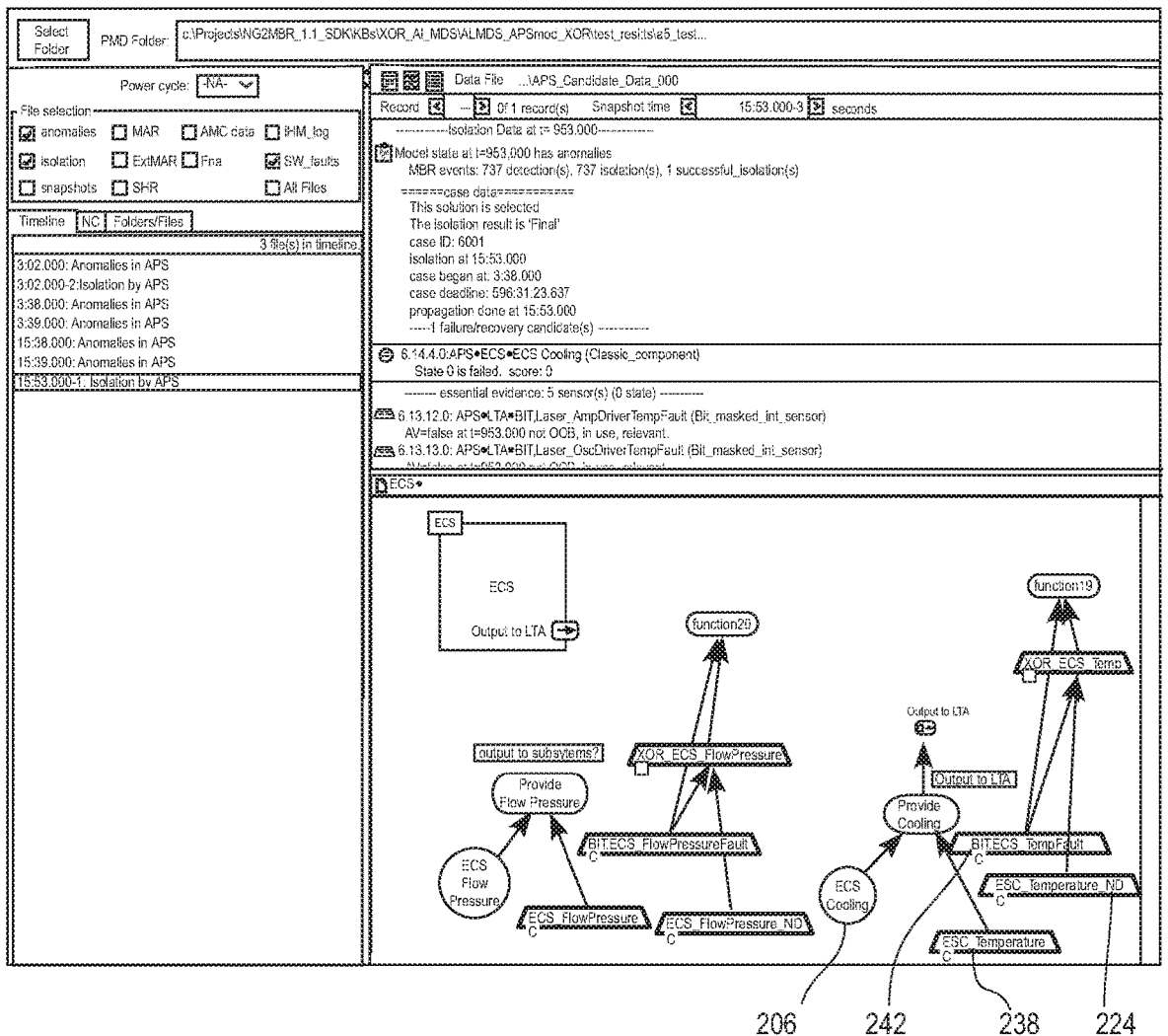
FIG. 9 shows an example of a fault analysis report.

An example of output data from a model test is shown in FIG. 9. MBR Engine 106 (FIG. 2) has isolated a fault for the ECS Cooling component, using a fault in both the parameterized ECS Temperature sensor represented as ECS_Temperature node 238 and supporting evidence in other subsystem components including other temperature sensors (in some of these cases, for example, an LTA Laser Amplifier Driver Temperature (not shown), the only data available is a BIT test, hence a BIT test node is used for supporting evidence in this case). The logic of the interconnected subsystems' sub-models as similarly shown in FIGS. 2 and 9 dictates this result when the parameterized sensor ECS_Temperature node 238 measuring the ECS temperature is determined to be an anomaly with appropriate supporting evidence. In addition, the BIT test BIT_EC_TempFault node 242 measuring the ECS Temperature anomaly is separately indicating a fault; this sensor node is non-diagnostic and therefore not used to determine system faults, but it is used as a comparator for the non-diagnostic ECS_Temperature_ND parametric sensor node 224. Variations between the BIT and parametric nodes can indicate a faulty BIT test or sensor, and are one of the capabilities added by implementing parameterized sensors.

Figure 10:
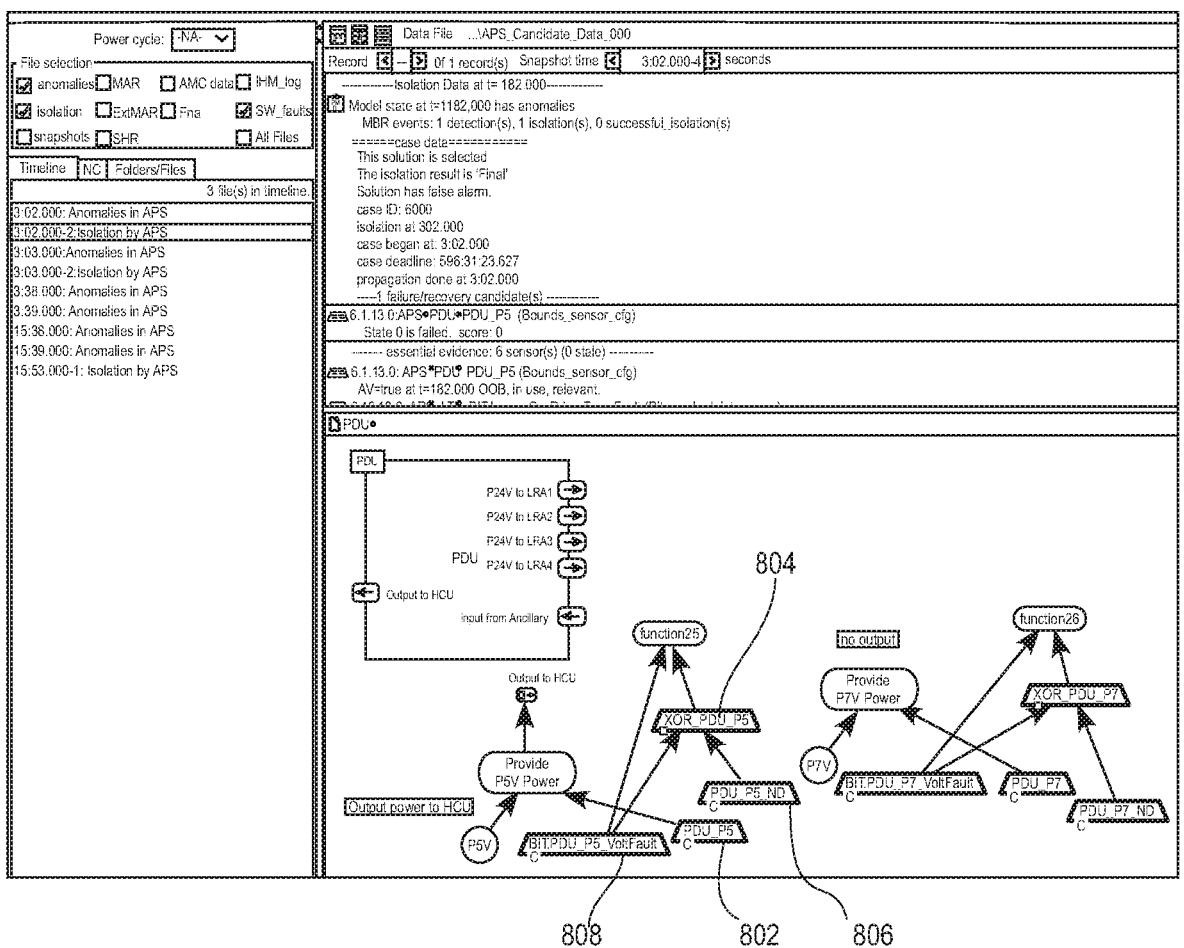
FIG. 10 shows an example of a false alarm report.

FIG. 10 shows an example of an output of MBR Engine 106 generating a False Alarm. In this case the Power Distribution Unit (PDU) P5V sensor 802, a parametric sensor measuring voltage in a PDU sub-model a system, is generating an anomaly because the data input for this subsystem is out of the defined parametric range. A parametric sensor node implementation allows for direct use of this sensor data, bypassing potentially troublesome hardware BIT test results. Parameterized nodes also allow analysis of quantitative data directly for calculation of confidence measures, windowing the data for spurious data points, and similar analysis. In this sub-model, a comparator analysis using XOR_PDU_P5 node 804 between the parametric node PDU_P5_ND 806 and BIT test data from BIT_PDU_P5_VoltFault 808 is made to determine if there are any discrepancies between these two results which would be indicative of a sensor or BIT test failure. In the example below, the anomaly is determined to be a False Alarm since other subsystems would expect a similar anomaly in the case of an actual fault in the system hardware. As no such other anomaly exists, the MBR Engine 106 is able to determine that this anomaly is a False Alarm.

The central purpose of the invention is to produce High Fidelity Real Time Diagnostics capability (False Alarm (FA) rejections, Fault Detection (FD), Fault Isolation (FI), and parameter trending for equipment failures) for all Northrop Grumman Corporation Sectors vehicles, aircrafts, and other systems. This invention will provide embedded software diagnostics capability on numerous hardware devices and operating systems, and system avionics integration for determining the health of the system during in-flight real-time system operations. By implementing parametric data input and XOR parametric-BIT comparator fusion, the system has the capability to analyze quantitative sensor input, develop sophisticated fault and false alarm confidence measures, and identify and analyze BIT failures while maintaining valid system health management and diagnostic capabilities.

If used and unless otherwise stated, the terms "upper," "lower," "front," "back," "over," "under," and similar such terms are not to be construed as limiting embodiments to a particular orientation. Instead, these terms are used only on a relative basis.

What is claimed is:

1. An on-board diagnostic system for a complex system comprising a computer processor and a non-volatile storage, comprising:
    an interface coupled to data busses for reading data including sensor data as it is being transmitted over the data busses during operation of the complex system from a plurality of sources to an intended reception device in the complex system;
    models representing operation of a plurality of subsystems that make up the complex system, said models further comprising a plurality of nodes in a graph, said nodes representing functions, components, and sensors for each of the subsystems of the complex system, at least some of said nodes representing parameterized data, direct analog sensor data and built-in-test (BIT) data generated by hardware devices in the subsystems, each of said models further comprising an XML model configuration file stored in the non-volatile storage where each file contains a corresponding representation of structure and functions of one of the subsystems;
    a model development and verification interface for creating and verifying the models;
    a model testing manager for evaluating the models during operation of the complex system;
    a model based reasoner (MBR) engine executed by the computer processor, said MBR engine receiving data read by the interface, implementing the models of the systems from the corresponding XML model configuration file, producing diagnostic analysis for each subsystem based on corresponding data, and determining if an anomaly exists in one BIT subsystem based on a diagnostic analysis of the one BIT subsystem and a diagnostic analysis of at least one other subsystem that is affected by the operation of the one BIT subsystem, the diagnostic analysis of the other subsystem providing confirming evidence of whether there is an anomaly in the one BIT subsystem; and
    a maintenance viewer for receiving the diagnostics analysis and data and providing actionable maintenance tasks and reports.

2. The system of claim 1, wherein the MBR engine determines, based on the diagnostic analysis of the one BIT subsystem determining an anomaly of the one BIT subsystem and the diagnostic analysis of the at least one other subsystem failing to provide confirming evidence of an anomaly in the one BIT subsystem, that the anomaly of the one BIT subsystem is a false positive and is in error.

3. The system of claim 2, wherein the MBR engine determination of the false positive is made in real time during operation of the complex system.

4. The system of claim 1, wherein the MBR engine determines, based on the diagnostic analysis of the one BIT subsystem determining an anomaly of the one BIT subsystem and the diagnostic analysis of the at least one other subsystem providing confirming evidence of an anomaly in the one BIT subsystem, that the anomaly of the one BIT subsystem is a valid anomaly.

5. The system of claim 4, wherein the MBR engine determination of the valid anomaly is made in real time during operation of the complex system.

6. The system of claim 1, wherein each XML model configuration file is a representation of the corresponding physical subsystem including its related sensors and logical function.

7. The system of claim 1, wherein the parameterized data further comprises a calibration value.

8. The system of claim 1, wherein at least one node further comprises a physical sensor node for providing BIT data to the model.

9. The system of claim 1, wherein at least one node further comprises a physical sensor node for providing direct physical sensor quantitative data to the model.

10. The system of claim 1, further comprising a graphical user interface for creating and testing the model representing the complex system.

11. A method of integrated vehicle health management (IVHM) for a complex system comprising:
    generating models representing each of a plurality of subsystems in the complex system, said models further comprising a plurality of nodes in a graph, said nodes representing functions, components, and sensors for each of the physical subsystems of the complex system, at least some of said nodes representing parameterized data, direct analog sensor data and built-in-test (BIT) data generated by hardware devices in the subsystems;
    testing the model during operation of the complex system;
    exporting the models of each of the subsystems to corresponding XML model configuration files;
    executing a model based reasoner (MBR) engine using the models and sensor data from a plurality of sources in the complex system and producing diagnostics analysis for each subsystem based on corresponding data;
    determining by the MBR engine if an anomaly exists in one BIT subsystem based on a diagnostics analysis of the one BIT subsystem and a diagnostic analysis of at least one other subsystem that is affected by the operation of the one BIT subsystem to confirm the anomaly in the one BIT subsystem; and
    performing maintenance of the complex system based on the diagnostics analysis and data.

12. The method of claim 11, wherein the determining by the MBR engine determining, based on the diagnostic analysis of the one BIT subsystem determining an anomaly of the one BIT subsystem and the diagnostic analysis of the at least one other subsystem failing to provide confirming evidence of an anomaly in the one BIT subsystem, that the anomaly of the one BIT subsystem is a false positive and is in error.

13. The method of claim 12, wherein the MBR engine determination of the false positive is made in real time during operation of the complex system.

14. The method of claim 11, wherein the determining by the MBR engine determining, based on the diagnostics analysis of the one BIT subsystem determining an anomaly of the one BIT subsystem and the diagnostic analysis of the at least one other subsystem providing confirming evidence of an anomaly in the one BIT subsystem, that the anomaly of the one BIT subsystem is a valid anomaly.

15. The method of claim 14, wherein the MBR engine determination of the valid anomaly is made in real time during operation of the complex system.

16. The method of claim 11, wherein each XML model configuration file is a representation of the corresponding physical subsystem including its related sensors and logical functions.

17. The method of claim 11, wherein the parameterized data further comprises a calibration value.

18. The method of claim 11, wherein at least one node further comprises a physical sensor node for providing BIT data to the model.

19. The method of claim 11, wherein at least one node further comprises a physical sensor node for providing direct physical sensor quantitative data to the model.

20. The method of claim 11, further comprising a graphical user interface for creating and testing the model representing the complex system.

* * * * *

UNITED STATES PATENT AND TRADEMARK OFFICE
CERTIFICATE OF CORRECTION

PATENT NO. : 10,676,048 B2
APPLICATION NO. : 16/163726
DATED : June 9, 2020
INVENTOR(S) : Sunil Dixit et al.

Page 1 of 1

It is certified that error appears in the above-identified patent and that said Letters Patent is hereby corrected as shown below:

In the Claims

In Claim 6, Column 10, Line 27, delete "function" and substitute --functions--.

Signed and Sealed this
Eighth Day of September, 2020

Andrei Iancu
*Director of the United States Patent and Trademark Office*